United States Patent
Farrar et al.

[11] Patent Number: 5,609,746
[45] Date of Patent: Mar. 11, 1997

[54] PRINTED CIRCUIT MANUFACTURE

[75] Inventors: Simon Farrar, Stoke-On-Trent; Neil Taylor, Worsley Mesnes, both of England

[73] Assignee: International Computers Limited, London, England

[21] Appl. No.: 538,469

[22] Filed: Oct. 3, 1995

[30] Foreign Application Priority Data

Oct. 6, 1994 [GB] United Kingdom ............ 9420182

[51] Int. Cl.$^6$ ............ C25D 5/02; C25D 5/48; C23C 28/02
[52] U.S. Cl. ............ 205/125; 205/126; 205/184; 205/223; 205/920; 216/13; 216/17; 216/48; 216/56; 216/65; 216/66
[58] Field of Search ............ 205/125, 126, 205/184, 223, 920; 216/13, 17, 48, 56, 65, 66

[56] References Cited

U.S. PATENT DOCUMENTS

| | | | |
|---|---|---|---|
| 3,163,588 | 12/1964 | Shortt et al. | 205/125 |
| 3,171,796 | 3/1965 | Stephens et al. | 205/125 |
| 3,867,217 | 2/1975 | Maggs et al. | 216/13 |
| 4,023,998 | 5/1977 | Cederberg | 156/630 |
| 4,389,993 | 8/1983 | Hume, Jr. | 156/643 |
| 4,644,130 | 2/1987 | Backmann | 219/121 LJ |
| 4,705,592 | 11/1987 | Bahrle et al. | 205/125 |
| 4,948,941 | 8/1990 | Altman | 219/121.71 |
| 5,158,645 | 10/1992 | Covert et al. | 216/48 |

FOREIGN PATENT DOCUMENTS 3001177  7/1981  Germany.

*Primary Examiner*—Kathryn Gorgos
*Assistant Examiner*—Edna Wong
*Attorney, Agent, or Firm*—Lee, Mann, Smith, McWilliams, Sweeney & Ohlson

[57] ABSTRACT

In the manufacture of a printed circuit board a sacrificial tin-lead layer is deposited on the surface of the board by electroplating. Holes are then formed in the board by UV laser ablation. Debris from the ablation process is adsorbed on the sacrificial layer. The sacrificial layer is then removed by means of a chemical stripping process, along with the debris.

7 Claims, 1 Drawing Sheet

PRINTED CIRCUIT MANUFACTURE

BACKGROUND TO THE INVENTION

This invention relates to the manufacture of printed circuit boards. More specifically, the invention is concerned with techniques for drilling holes in such circuit boards. It has been proposed to drill holes in a printed circuit board using a laser of suitable power and wavelength. This process is generally referred to as laser ablation. For example, an ultraviolet laser, such as an excimer laser, is suitable for ablating holes through resin-based circuit board substrates. Metal layers on the surface of the board can be used as masks, to define the required pattern of holes.

It has been found that debris from the ablation process (comprising particles of material ejected from the drilled hole) tends to be deposited on the surface of the circuit board, contaminating the board and causing difficulties with subsequent plating steps.

The object of the invention is to provide a way of overcoming this problem.

SUMMARY OF THE INVENTION

According to the invention there is provided a method of manufacturing a printed circuit board, including the steps:

(a) depositing a sacrificial layer on the surface of the board;

(b) forming a hole in said board by laser ablation, debris from the ablation process being adsorbed on said sacrificial layer; and (c) removing said sacrificial layer, along with said debris.

DESCRIPTION OF AN EMBODIMENT OF THE INVENTION

One embodiment of the invention will now be described by way of example with reference to the accompanying drawings.

Figure 1:
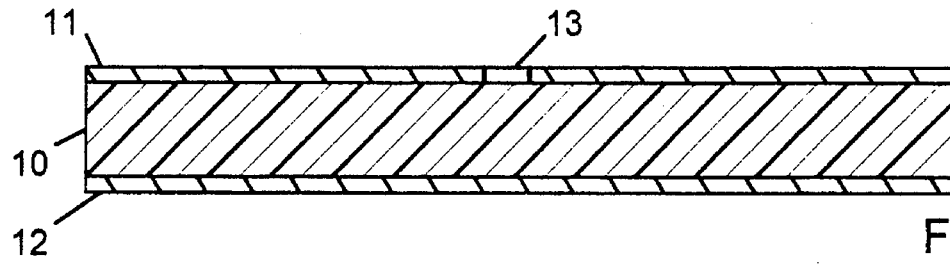
FIGS. 1–4 show successive steps in a process for manufacturing a printed circuit board (PCB).

Referring to FIG. 1, a PCB is formed from a resin-based substrate 10, with copper layers 11,12 on both sides. Holes 13 (only one shown) are formed in the upper copper layer 11, by conventional masking and etching techniques. These holes define the positions of holes to be formed through the substrate 10.

Figure 2:
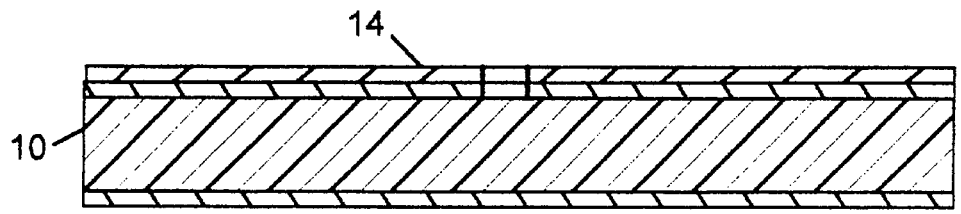

Referring to FIG. 2, the next step in the process is to electrolytically deposit a tin-lead layer 14 of approximately twelve microns thickness, on top of the copper layer 11. In this example, the tin-lead plating solution is fluoboric acid based. Deposition of the tin-lead layer occurs only on the copper-clad areas, leaving the holes 13 free from tin-lead.

Figure 3:
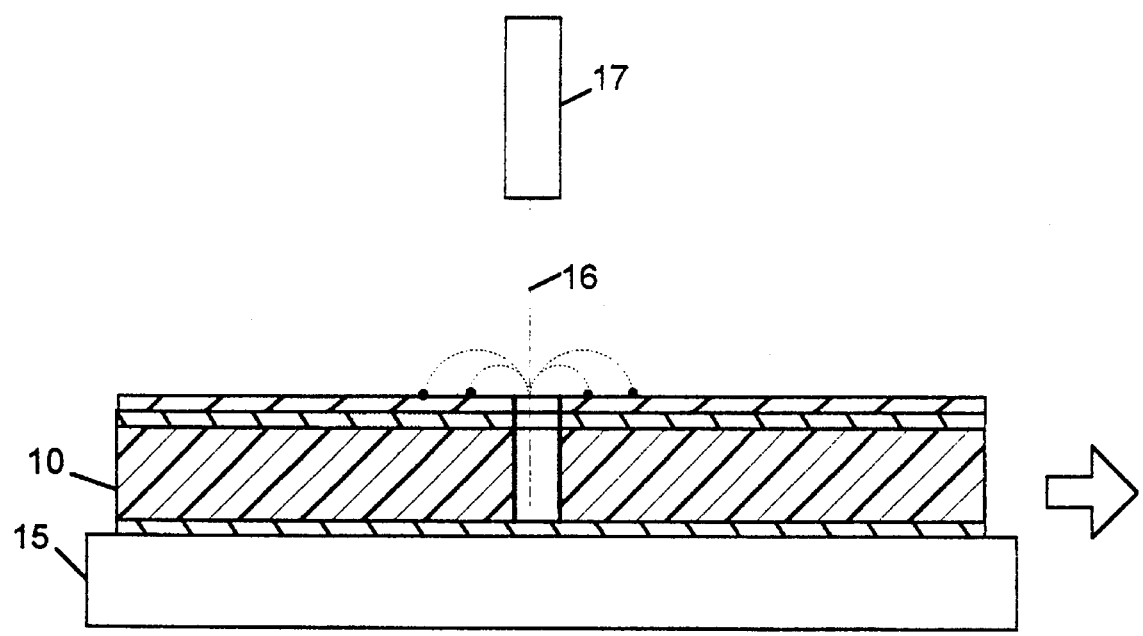

Referring to FIG. 3, the board is then mounted on a scanning table 15, and is exposed to a beam 16 from a pulsed ultraviolet (UV) excimer laser 17. In this example, the laser 17 is a Lumonics Index 200-K laser, running on a krypton-fluoride gas mixture and providing pulses of 16 nanoseconds duration at a wavelength of 248 nanometers. The laser energy density is approximately 2 joules per square centimeter per pulse, with a pulse repetition frequency of approximately 200 hertz.

The table 15 is indexed in two dimensions, by means of motors (not shown) so as to move the board in a predetermined pattern relative to the beam, such that all the areas of the board to be ablated are scanned by the beam. The scanning speed is approximately 2 millimeters per second.

The laser beam is absorbed by and ablates the exposed regions of the substrate 10, through the holes 13, so as to form holes through the substrate. The cross-sections of the holes are defined by the holes 13 in the upper layer 11; in other words, the layer 11 acts as a mask to define the required pattern of holes in the substrate. The holes terminate when they reach the lower copper layer 12, since the copper reflects the laser energy rather than absorbing it.

During the drilling process, high pressure differentials are created in the hole by the acoustic piston behaviour of the material removal, and this causes ablation fragments to be ejected from the hole and deposited on top of the tin-lead layer 14 around the ablated holes. The laser radiation incident upon the area around the ablated holes causes the tin-lead to reflow, and this aids adsorption of the debris by the tin-lead layer.

Figure 4:
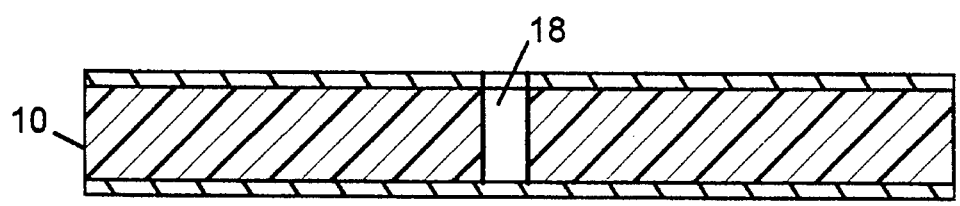

Referring to FIG. 4, the tin-lead layer, which now includes the adsorbed debris from the ablation process, is then chemically stripped by immersion in a tin-lead stripper solution. In this example, the stripper solution is nitric acid based (40%), and is an alpha/beta 2-stage system. The ablated holes 18 and the surface of the copper layer 11 are left clean and debris-free for subsequent plating stages.

In summary, it can be seen that the tin-lead layer acts as a sacrificial layer, for trapping the debris from the laser drilling process.

It will be appreciated that many modifications may be made to the process described above without departing from the scope of the invention.

We claim:

1. A method of manufacturing a printed circuit board, including the steps:

(a) depositing a sacrificial layer on the surface of the board;

(b) forming a hole in said board by laser ablation, debris from the ablation process being adsorbed on said sacrificial layer; and (c) removing said sacrificial layer by means of a chemical stripping process, where said debris adsorbed on said sacrificial layer is removed simultaneously with said sacrificial layer.

2. A method according to claim 1 wherein said sacrificial layer comprises a tin-lead layer.

3. A method according to claim 1 wherein said sacrificial layer is deposited by means of an electroplating process.

4. A method according to claim 1 wherein said laser ablation is performed using a UV laser.

5. A method of manufacturing a printed circuit board, including the steps:

(a) forming a substrate with at least one conductive layer on a surface of the substrate, said conductive layer having at least one aperture formed therein;

(b) electroplating a sacrificial layer onto said conductive layer, said sacrificial layer covering said conductive layer while leaving said hole uncovered;

(c) forming a hole through said substrate by exposing said substrate to a laser beam through said aperture, debris from formation of said hole being adsorbed on said sacrificial layer; and (d) removing said sacrificial layer by means of a chemical stripping process, where the debris adsorbed on said sacrificial layer is removed simultaneously with said sacrificial layer.

6. A method according to claim 5 wherein said sacrifical layer comprises a tin-lead layer.

7. A method according to claim 5 wherein said laser ablation is performed using a UV laser.

* * * * *